United States Patent
Lee et al.

(10) Patent No.: US 12,062,626 B2
(45) Date of Patent: *Aug. 13, 2024

(54) SEMICONDUCTOR SUBSTRATE AND METHOD OF SAWING THE SAME

(71) Applicant: Samsung Electronics Co., Ltd., Suwon-si (KR)

(72) Inventors: Hwayoung Lee, Hwaseong-si (KR); Heejae Nam, Asan-si (KR); Byungmoon Bae, Daegu (KR); Junggeun Shin, Cheonan-si (KR); Hyunsu Sim, Cheonan-si (KR); Junho Yoon, Anyang-si (KR); Dongjin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/144,902

(22) Filed: May 9, 2023

(65) Prior Publication Data

US 2023/0275037 A1     Aug. 31, 2023

Related U.S. Application Data

(63) Continuation of application No. 17/216,279, filed on Mar. 29, 2021, now Pat. No. 11,676,914.

(30) Foreign Application Priority Data

Aug. 20, 2020   (KR) .................... 10-2020-0104419

(51) Int. Cl.
   *H01L 23/00*    (2006.01)
   *H01L 21/78*    (2006.01)
   *H01L 23/544*   (2006.01)

(52) U.S. Cl.
   CPC ............ *H01L 23/562* (2013.01); *H01L 21/78* (2013.01); *H01L 23/544* (2013.01); *H01L 2223/5446* (2013.01)

(58) Field of Classification Search
   CPC ..... H01L 23/562; H01L 21/78; H01L 23/544; H01L 2223/5446; H01L 21/304; H01L 21/6836; H01L 2221/68327; B23K 26/38
   See application file for complete search history.

(56) References Cited

U.S. PATENT DOCUMENTS

| | | |
|---|---|---|
| 8,836,084 B2 | 9/2014 | Chen et al. |
| 8,865,567 B2 | 10/2014 | Tamenori |
| 9,349,710 B2 | 5/2016 | Chen et al. |

(Continued)

FOREIGN PATENT DOCUMENTS

KR     20200007217 A     1/2020

*Primary Examiner* — Thanh T Nguyen
(74) *Attorney, Agent, or Firm* — Muir Patent Law, PLLC

(57) ABSTRACT

A semiconductor substrate may include a plurality of semiconductor chips and a protection pattern. The semiconductor chips may be divided by two scribe lanes intersecting each other. Corners of the semiconductor chips may be disposed at the intersection of the two scribe lanes. The protection pattern may be arranged at the intersection of the scribe lanes to surround the corners of the semiconductor chips. Thus, the corners of the semiconductor chips may be protected by the protection pattern form colliding with each other in a following grinding process.

19 Claims, 10 Drawing Sheets

(56) References Cited

U.S. PATENT DOCUMENTS

| | | |
|---|---|---|
| 10,119,921 B2 | 11/2018 | Takeda et al. |
| 10,651,105 B2 | 5/2020 | Kim et al. |
| 11,676,914 B2 * | 6/2023 | Lee .................. H01L 23/544 |
| | | 257/620 |
| 2006/0278957 A1 | 12/2006 | Lin et al. |
| 2008/0128864 A1 | 6/2008 | Cho |
| 2008/0128904 A1 | 6/2008 | Sakamoto |
| 2010/0072578 A1 | 3/2010 | Kunishima |
| 2020/0020604 A1 | 1/2020 | Kim et al. |
| 2020/0381322 A1 | 12/2020 | Kim et al. |

* cited by examiner

SEMICONDUCTOR SUBSTRATE AND METHOD OF SAWING THE SAME

CROSS-RELATED APPLICATION

This application is a continuation of U.S. application Ser. No. 17/216,279, filed Mar. 29, 2021, in the U.S. Patent and Trademark Office, which claims priority under 35 USC § 119 to Korean Patent Application No. 10-2020-0104419, filed Aug. 20, 2020, in the Korean Intellectual Property Office (KIPO), the contents of both of which are herein incorporated by reference in their entireties.

BACKGROUND

1. Field

Example embodiments relate to a semiconductor substrate and a method of sawing the same. More particularly, example embodiments relate to a semiconductor substrate including a plurality of semiconductor chips, and a method of sawing the semiconductor substrate.

2. Description of the Related Art

Generally, a plurality of semiconductor chips formed on a semiconductor substrate may be divided by a scribe lane. The semiconductor chips may be connected with each other using a die attach film. The semiconductor substrate may be cut along the scribe lane to singulate the semiconductor chips. A thickness of each of the semiconductor chips may be reduced by a grinding process.

According to related art, the semiconductor chips may be connected with each other via the die attach film. In the grinding process, corners of the adjacent semiconductor chips may collide against each other to generate cracks at the semiconductor chips.

SUMMARY

Example embodiments provide a semiconductor substrate that may be beneficial in preventing a collision of corners of semiconductor chips in a grinding process.

Example embodiments also provide a method of sawing the above-mentioned semiconductor substrate.

According to example embodiments, there may be provided a semiconductor substrate. The semiconductor substrate may include first to fourth semiconductor chips, a first protection pattern, a second protection pattern, a third protection pattern and a fourth protection pattern. The first to fourth semiconductor chips may be divided by two scribe lanes intersecting each other. The first to fourth semiconductor chips may respectively include first to fourth corners disposed at the intersection of the two scribe lanes. The first protection pattern may be arranged at the intersection of the scribe lanes to surround the first corner of the first semiconductor chip. The second protection pattern may be arranged at the intersection of the scribe lanes to surround the second corner of the second semiconductor chip. The third protection pattern may be arranged at the intersection of the scribe lanes to surround the third corner of the third semiconductor chip. The fourth protection pattern may be arranged at the intersection of the scribe lanes to surround the fourth corner of the fourth semiconductor chip. The first to fourth protection patterns may have the same shape. The first to fourth protection patterns may have a width of about 3/60 time to about 4/60 times a width of the scribe lane.

According to example embodiments, there may be provided a semiconductor substrate. The semiconductor substrate may include a plurality of semiconductor chips and a protection pattern. The semiconductor chips may be divided by two scribe lanes intersecting each other. The semiconductor chips may include respective corners disposed at the intersection of the two scribe lanes. The protection pattern may be arranged at the intersection of the scribe lanes to surround the corners of the semiconductor chips.

According to example embodiments, there may be provided a method of sawing a semiconductor substrate. In the method of sawing the semiconductor substrate, a protection pattern may be formed in a scribe lane of the semiconductor substrate including a plurality of semiconductor chips. The protection pattern may surround corners of the semiconductor chips. A die attach film may be attached to a lower surface of the semiconductor substrate. The semiconductor substrate may be cut along the scribe lane. An upper portion of the semiconductor substrate may be removed by a grinding process.

According to example embodiments, the protection pattern in the scribe lane of the semiconductor substrate may surround the corners of the semiconductor chips to prevent the collision of the corners of the semiconductor chips in the grinding process. Thus, a crack may not be generated at the semiconductor chips.

BRIEF DESCRIPTION OF THE DRAWINGS

Example embodiments will be more clearly understood from the following detailed description taken in conjunction with the accompanying drawings.

FIG. 1 is a perspective view illustrating a semiconductor substrate in accordance with example embodiments;

FIG. 2 is an enlarged plan view illustrating semiconductor chips and protection patterns formed in the semiconductor substrate illustrated in FIG. 1;

FIG. 3 is a cross-sectional view taken along a line A-A' indicated in FIG. 2;

FIGS. 4 to 7 are cross-sectional views, FIG. 8 is a perspective view, and FIG. 9 is a plan view, collectively illustrating a method of sawing the semiconductor substrate in FIG. 1;

FIG. 10 is a perspective view illustrating a semiconductor substrate in accordance with example embodiments;

FIG. 11 is an enlarged plan view illustrating semiconductor chips and protection patterns formed in the semiconductor substrate illustrated in FIG. 10;

FIG. 12 is a cross-sectional view taken along a line B-B' indicated in FIG. 11; and FIGS. 13 to 16 are cross-sectional views, FIG. 17 is a perspective view, and FIG. 18 is a plan view, collectively illustrating a method of sawing the semiconductor substrate in FIG. 10.

DETAILED DESCRIPTION OF THE EMBODIMENTS

Hereinafter, example embodiments will be explained in detail with reference to the accompanying drawings.

Figure 1:
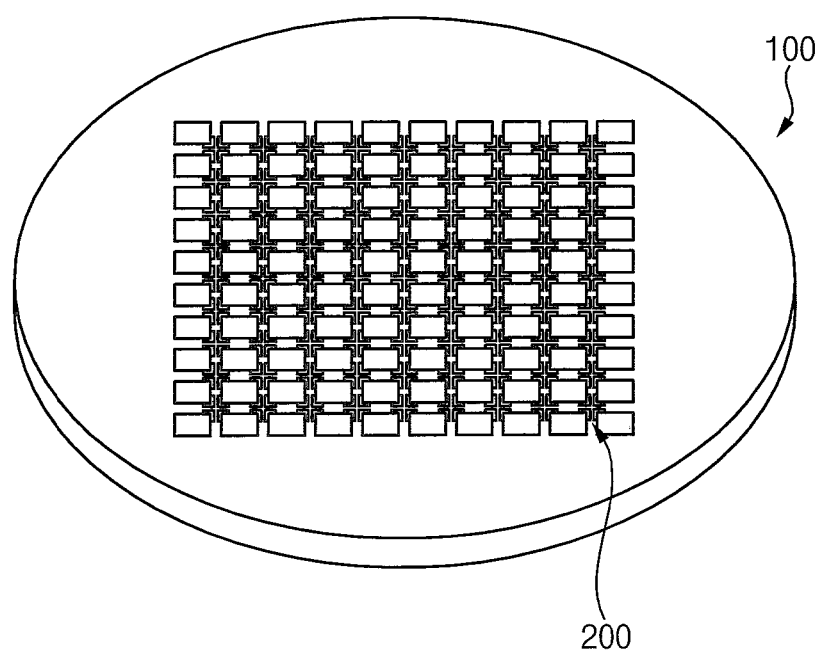
FIGS. 1 to 18 represent non-limiting, example embodiments as described herein.
Figure 2:
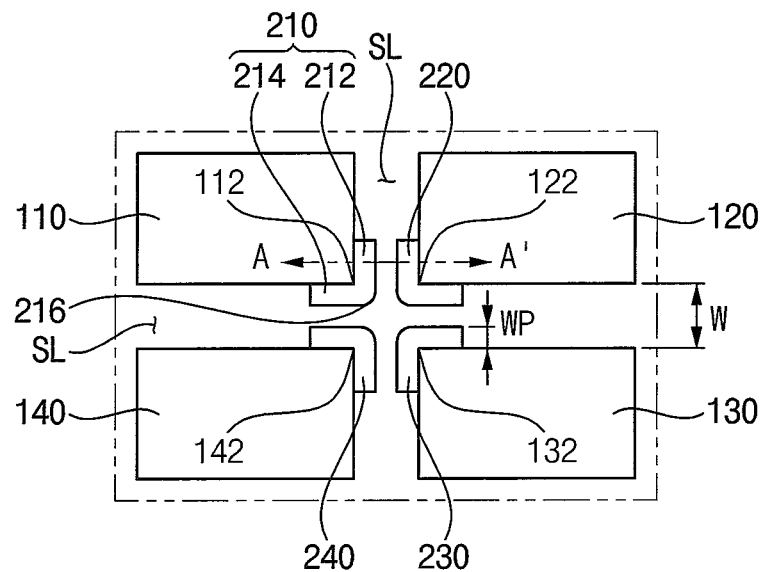
Figure 3:
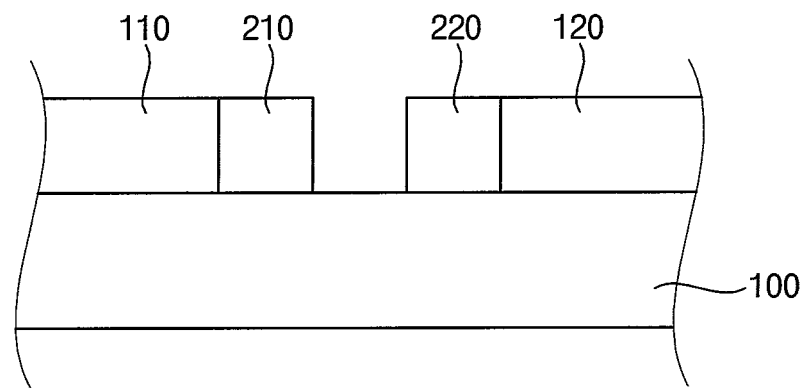

FIG. 1 is a perspective view illustrating a semiconductor substrate in accordance with example embodiments, FIG. 2 is an enlarged plan view illustrating semiconductor chips and protection patterns formed in the semiconductor substrate illustrated in FIG. 1, and FIG. 3 is a cross-sectional view taken along a line A-A' indicated in FIG. 2.

Referring to FIGS. 1 to 3, a semiconductor substrate 100 of example embodiments may include a plurality of semiconductor chips and a plurality of protection patterns 200.

The semiconductor chips may be formed in the semiconductor substrate 100. The semiconductor chips may be divided from each other by scribe lanes SL. Thus, the scribe lanes SL may have a shape configured to individually surround each of the semiconductor chips. Each of the semiconductor chips may have a rectangular shape in a plan view. Therefore, each of the semiconductor chips may have four side surfaces, e.g., in a plan view. For example, the semiconductor chips may be arranged along lengthwise and breadthwise directions by a uniform gap. For example, the semiconductor chips may be arranged in matrix form to be regularly spaced apart from each other. In this case, the scribe lanes SL configured to divide the semiconductor chips may intersect each other and may have cross shapes in the intersections. For example, the scribe lanes SL may have a rectangular frame shape configured to individually surround each of the semiconductor chips.

In example embodiments shown in FIG. 2, adjacent four semiconductor chips including a first semiconductor chip 110, a second semiconductor chip 120, a third semiconductor chip 130 and a fourth semiconductor chip 140 are illustrated. As illustrated in FIG. 2, from a top-down view, the second semiconductor chip 120 may be positioned on the right of the first semiconductor chip 110. The third semiconductor chip 130 may be positioned under the first semiconductor chip 110. The fourth semiconductor chip 140 may be positioned under the second semiconductor chip 120.

The scribe lanes SL may extend between the first semiconductor chip 110 and the second semiconductor chip 120, between the third semiconductor chip 130 and the fourth semiconductor chip 140, between the first semiconductor chip 110 and the third semiconductor chip 130, and between the second semiconductor chip 120 and the fourth semiconductor chip 140. The scribe lanes SL may have a width W of about 60 μm. However, the width W of the scribe lanes SL is not restricted to the above value.

Therefore, the first semiconductor chip 110 may have a first corner 112 disposed at an intersection of the scribe lanes SL. The second semiconductor chip 120 may have a second corner 122 disposed at the intersection of the scribe lanes SL. The third semiconductor chip 130 may have a third corner 132 disposed at the intersection of the scribe lanes SL. The fourth semiconductor chip 140 may have a fourth corner 142 disposed at the intersection of the scribe lanes SL. For example, the first corner 112, the second corner 122, the third corner 132 and the fourth corner 142 may be positioned adjacent to each other at the intersection of the scribe lanes SL.

In order to reduce thicknesses of the first semiconductor chip 110, the second semiconductor chip 120, the third semiconductor chip 130 and the fourth semiconductor chip 140, while the first semiconductor chip 110, the second semiconductor chip 120, the third semiconductor chip 130 and the fourth semiconductor chip 140 are attached on a die attach film (DAF), an upper portion of the semiconductor substrate 100 may be removed by a grinding process. For example, when viewed from a cross-sectional view, upper portions of the first semiconductor chip 110, the second semiconductor chip 120, the third semiconductor chip 130 and the fourth semiconductor chip 140 may be removed by the grinding process while the first to fourth semiconductor chips 110, 120, 130 and 140 are attached on the DAF. In the grinding process, the first semiconductor chip 110, the second semiconductor chip 120, the third semiconductor chip 130 and the fourth semiconductor chip 140 may move with respect to each other. For example, distances between the semiconductor chips 110, 120, 130 and 140 may vary while the grinding process is performed because the DAF may be flexible. The first corner 112, the second corner 122, the third corner 132 and/or the fourth corner 142 may collide with each other to generate a crack at the first corner 112, the second corner 122, the third corner 132 and/or the fourth corner 142.

In order to prevent the collision between the first corner 112, the second corner 122, the third corner 132 and/or the fourth corner 142, a protection pattern 200 may be arranged in a scribe lane SL. For example, the protection pattern 200 may be formed on an upper surface of the scribe lane SL. For example, the protection pattern 200 may be a part separate from the first semiconductor chip 110, the second semiconductor chip 120, the third semiconductor chip 130 and the fourth semiconductor chip 140. The protection pattern 200 may contact the first corner 112, the second corner 122, the third corner 132 and/or the fourth corner 142. Alternatively, the protection pattern 200 may be spaced apart from the first corner 112, the second corner 122, the third corner 132 and the fourth corner 142.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In example embodiments, the protection pattern 200 may include a first protection pattern 210, a second protection pattern 220, a third protection pattern 230 and a fourth protection pattern 240. For example, the first to fourth protection patterns 210, 220, 230 and 240 may be sub patterns of the protection pattern 200. The first protection pattern 210 may surround the first corner 112. The second protection pattern 220 may surround the second corner 122. The third protection pattern 230 may surround the third corner 132. The fourth protection pattern 240 may surround the fourth corner 142.

For example, the first protection pattern 210, the second protection pattern 220, the third protection pattern 230 and the fourth protection pattern 240 may have substantially the same shape. For example, the first protection pattern 210 may include or may be formed of two orthogonal portions 212 and 214, e.g., extending perpendicularly to each other. The two portions 212 and 214 of the first protection pattern 210 may have a uniform width. For example, a width of a first portion 212 in a direction perpendicular to the lengthwise direction of the first portion 212 may be the same as a width of the second portion 214 in a direction perpendicularly to the lengthwise direction of the second portion 214. The two portions 212 and 214 of the first protection pattern 210 may surround the first corner 112. Thus, in the grinding process, the first corner 112, the second corner 122, the third corner 132 and/or the fourth corner 142 surrounded by the respective first to fourth protection patterns 210, 220, 230 and 240 in the same way as the one described above with respect to the two portions 212 and 214 of the first protection pattern 210 may not collide with each other.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

A rounded corner 216 may be formed at a connected portion between the first and second portions 212 and 214. The second to fourth protection patterns 220, 230 and 240 may also have round corners at respective connection portions of corresponding two portions similarly to the first protection pattern 210. As mentioned above, although the first corner 112 surrounded by the first protection pattern 210, the second corner 122 surrounded by the second protection pattern 220, the third corner 132 surrounded by the third protection pattern 230, and the fourth corner 142 surrounded by the fourth protection pattern 240 may not collide with each other, a collision may be generated between the first protection pattern 210, the second protection pattern 220, the third protection pattern 230 and the fourth protection pattern 240, e.g., at the corners of the first to fourth protection patterns 210, 220, 230 and 240. When the protection patterns 210, 220, 230 and 240 have sharp corners instead of the round corners at the connection portions of corresponding orthogonal portions, the collision between the sharp corners of the first to fourth protection patterns 210, 220, 230 and 240 may bring about particles from the first to fourth protection patterns 210, 220, 230 and 240. For example, the sharp corners of the protection patterns 210, 220, 230 and 240 may break into particles by collisions between the protection patterns. However, because the rounded corner 216 may be formed at the connected portion between the two portions 212 and 214, the particle generation caused by the collision between the corners of the first to fourth protection patterns 210, 220, 230 and 240 may be suppressed.

Each of the first protection pattern 210, the second protection patterns 220, the third protection pattern 230 and the fourth protection pattern 240 may have a width Wp of about 3/60 times to about 4/60 times the width W of the scribe lane SL. For example, when the width W of the scribe lane SL is about 60 μm, the width Wp of the first to fourth protection patterns 210, 220, 230 and 240 may be about 3 μm to about 4 μm. However, the width Wp of the first to fourth protection patterns 210, 220, 230 and 240 is not restricted to the above range.

Therefore, a portion of the intersection of the scribe lanes SL may be exposed between the first protection pattern 210, the second protection pattern 220, the third protection pattern 230 and the fourth protection pattern 240. In a sawing process of the semiconductor substrate 100, a laser may be irradiated to the exposed portion of the scribe lanes SL.

In certain embodiments, the first protection pattern 210, the second protection pattern 220, the third protection pattern 230 and the fourth protection pattern 240 may have upper surfaces substantially coplanar with upper surfaces of the first semiconductor chip 110, the second semiconductor chip 120, the third semiconductor chip 130 and the fourth semiconductor chip 140. Alternatively, the upper surfaces of the first protection pattern 210, the second protection pattern 220, the third protection pattern 230 and the fourth protection pattern 240 may be positioned below the upper surfaces of the first semiconductor chip 110, the second semiconductor chip 120, the third semiconductor chip 130 and the fourth semiconductor chip 140.

The first protection pattern 210, the second protection pattern 220, the third protection pattern 230 and the fourth protection pattern 240 may include or may be formed of an insulation material. For example, the first protection pattern 210, the second protection pattern 220, the third protection pattern 230 and the fourth protection pattern 240 may include or may be formed of photosensitive polyimide.

Figure 6:
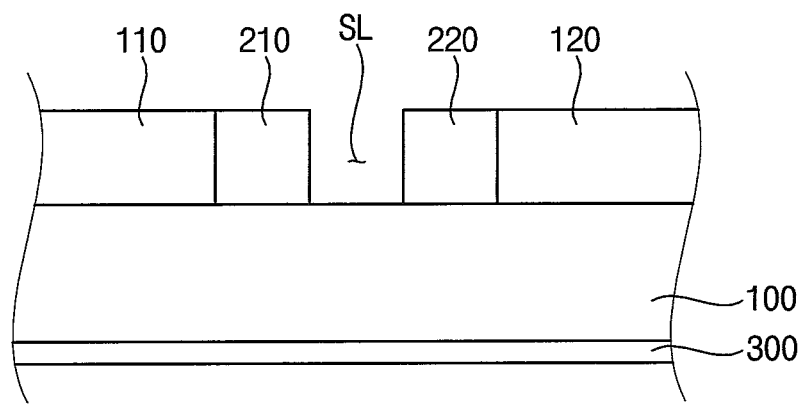
Figure 7:
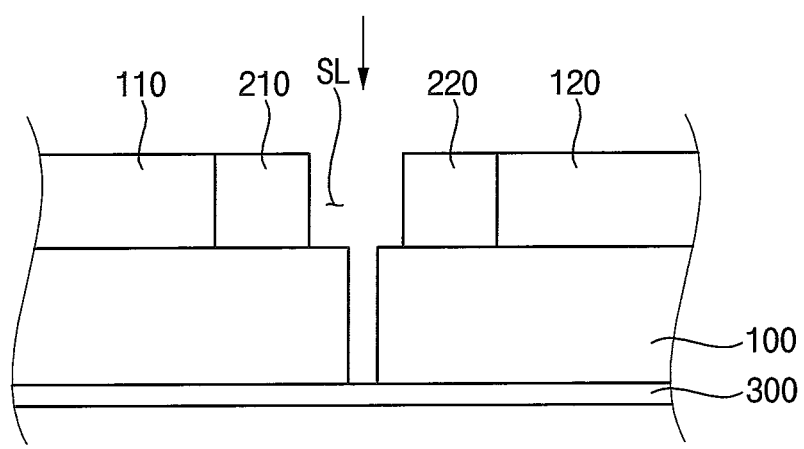
Figure 8:
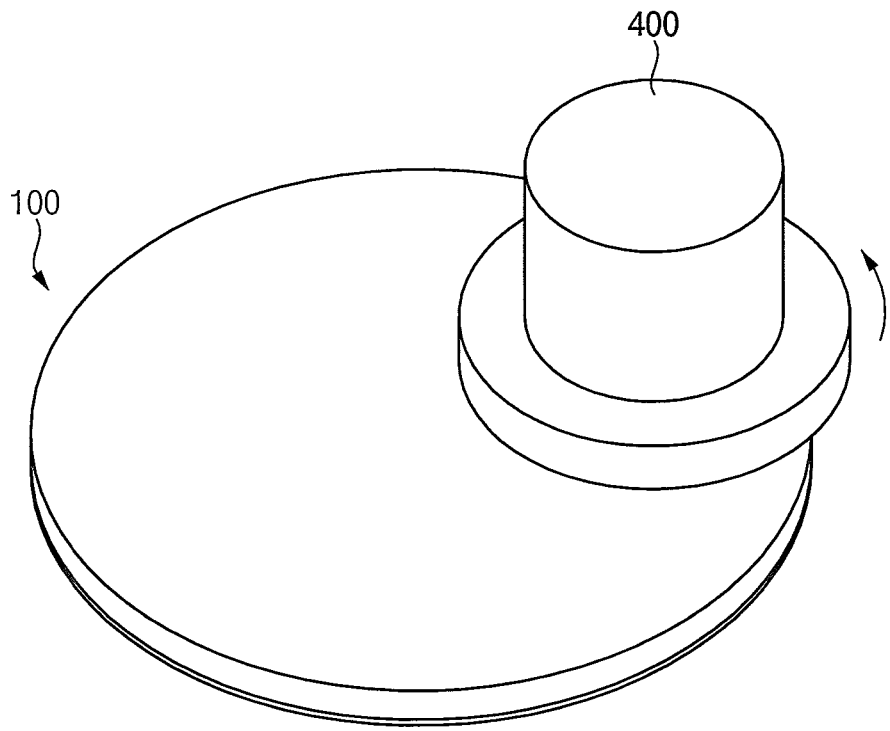
Figure 9:
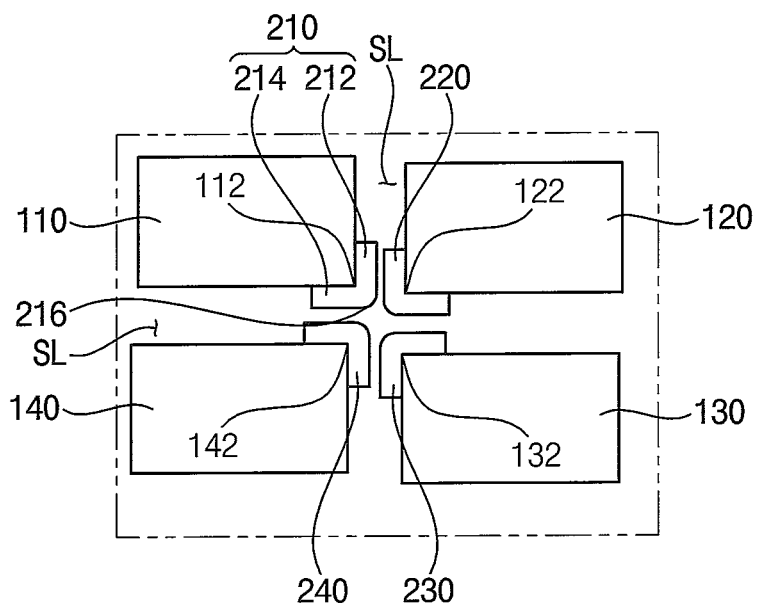

FIGS. 4 to 7 are cross-sectional views, FIG. 8 is a perspective view, and FIG. 9 is a plan view, collectively illustrating a method of sawing the semiconductor substrate in FIG. 1.

Figure 4:
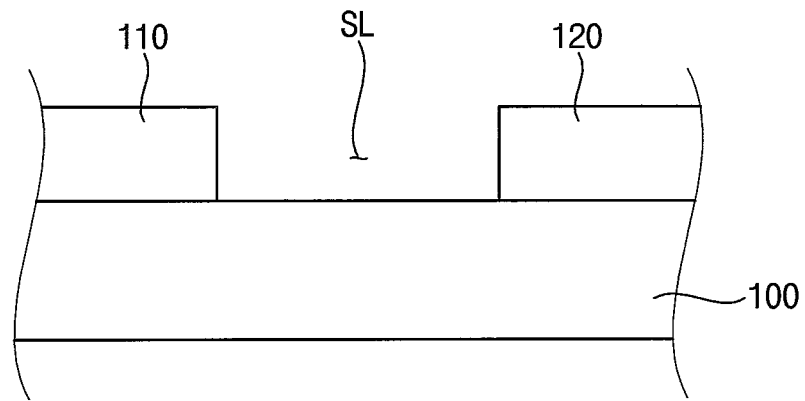

Referring to FIG. 4, the semiconductor chips in the semiconductor substrate 100 may be divided by a scribe lane SL. FIG. 4 shows only the first semiconductor chip 110 and the second semiconductor chip 120 among the semiconductor chips.

Figure 5:
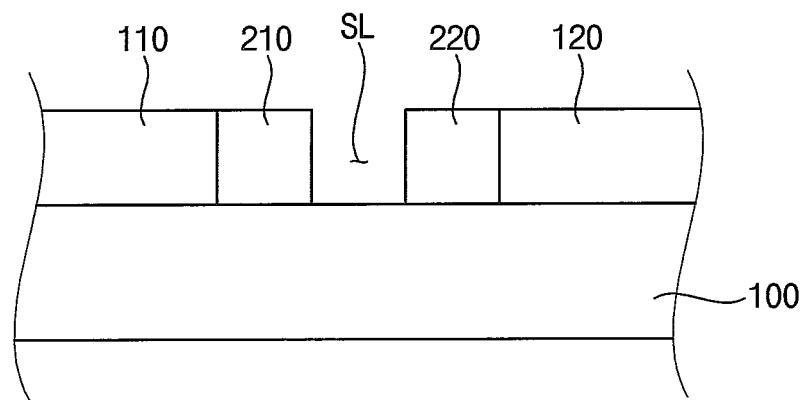

Referring to FIG. 5, the first protection pattern 210 and the second protection pattern 220 may be formed on the upper surface of the scribe lane SL. Because the first protection pattern 210 and the second protection pattern 220 may be spaced apart from each other by the uniform gap, the upper surface of the scribe lane SL between the first protection pattern 210 and the second protection pattern 220 may be exposed, e.g., between the first and second protection patterns 210 and 220. The first protection pattern 210 and the second protection pattern 220 may include or may be formed of photosensitive polyimide.

Referring to FIG. 6, the DAF 300 may be attached to the lower surface of the semiconductor substrate 100.

Referring to FIG. 7, the laser may be irradiated to the exposed portion of the scribe lane SL between the first protection pattern 210 and the second protection pattern 220 to cut the semiconductor substrate 100 along the scribe lane SL. However, because the laser may not be irradiated to the DAF 300, the DAF 300 may not be cut. Thus, a cut line may be formed by the laser between the first semiconductor chip 110 and the second semiconductor chip 120. However, the first semiconductor chip 110 and the second semiconductor chip 120 may be connected with each other by the DAF 300 so that the first semiconductor chip 110 and the second semiconductor chip 120 may not be separated from each other. For example, the first and second semiconductor chips 110 and 120 may be attached on the DAF 300 after being cut apart from each other by the laser. Because the DAF 300 may include or may be formed of a flexible material, the first semiconductor chip 110 and the second semiconductor chip 120 may slightly move with respect to each other while the first and second semiconductor chips 110 and 120 are attached on the DAF 300.

Referring to FIG. 8, the upper surface of the semiconductor substrate 100 may be ground using a grinder to reduce the thickness of the semiconductor substrate 100, i.e., the thicknesses of the first to fourth semiconductor chips 110, 120, 130 and 140.

The rotating grinder may grind the upper surface of the semiconductor substrate 100 so that the first to fourth corners 112, 122, 132 and 142 of the first to fourth semiconductor chips 110, 120, 130 and 140 may enter into the scribe lane SL to generate the collision between the first to fourth corners 112, 122, 132 and 142. For example, the DAF 300 may be flexible, and the first to fourth semiconductor chips 110, 120, 130 and 140 may move because of the flexibility of the DAF 300 so that the first to fourth semiconductor chips 110, 120, 130 and 140 may collide into each other.

However, as shown in FIG. 9, the first to fourth protection patterns 210, 220, 230 and 240 may surround the first to fourth corners 112, 122, 132 and 142 of the first to fourth semiconductor chips 110, 120, 130 and 140, respectively. Thus, the first to fourth corners 112, 122, 132 and 142 may be protected by the first to fourth protection patterns 210, 220, 230 and 240 and may not collide with each other. As a result, the crack, which may be caused by direct collisions between the first to fourth corners 112, 122, 132 and 142, may not be generated at the first to fourth semiconductor chips 110, 120, 130 and 140.

Figure 10:
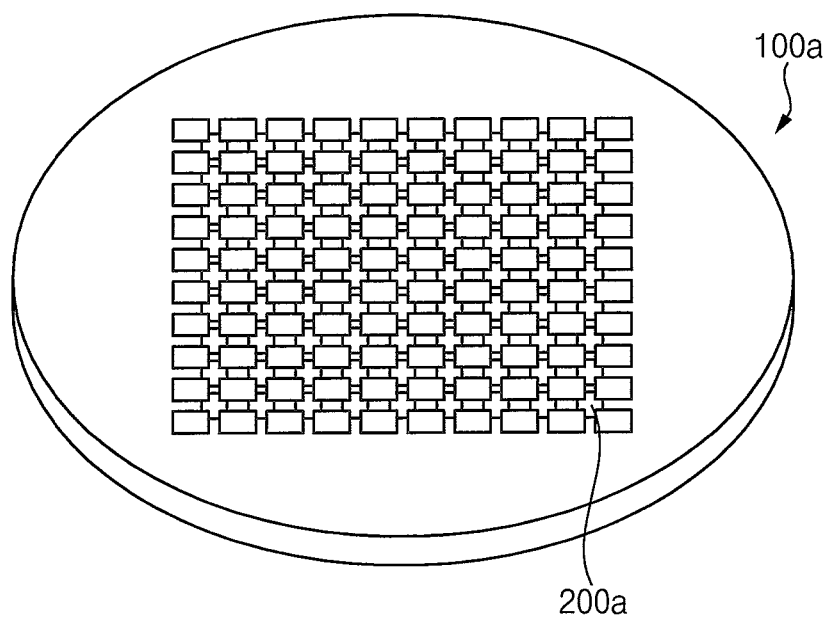
Figure 11:
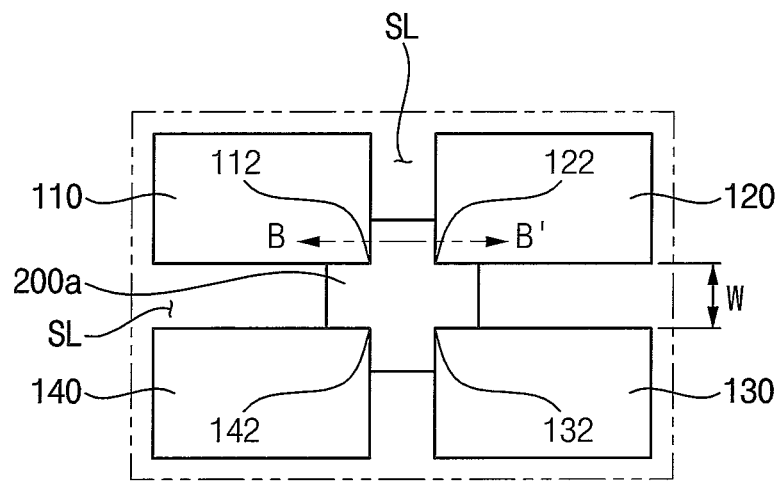
Figure 12:
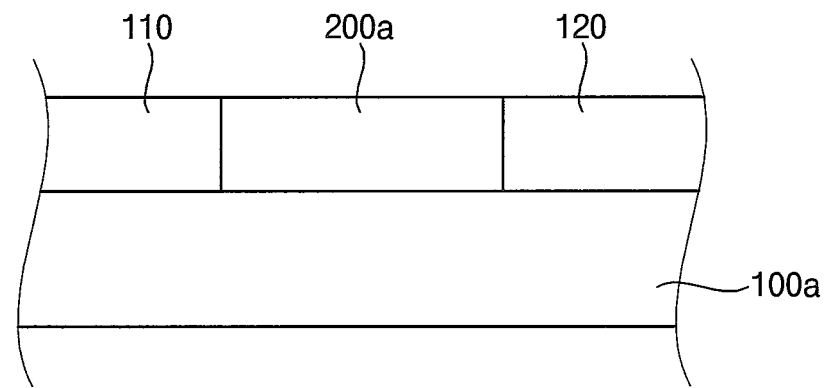

FIG. 10 is a perspective view illustrating a semiconductor substrate in accordance with example embodiments, FIG. 11 is an enlarged plan view illustrating semiconductor chips and protection patterns formed in the semiconductor substrate illustrated in FIG. 10, and FIG. 12 is a cross-sectional view taken along a line B-B' indicated in FIG. 11.

A semiconductor substrate 100a of this example embodiment may include or may be formed of elements substantially the same as those of the semiconductor substrate 100 in FIG. 1 except for a protection pattern. Thus, the same reference numerals may refer to the same elements and further descriptions with respect to the same elements may be omitted herein for brevity.

Referring to FIGS. 10 to 12, a protection pattern 200a of this example embodiment may be one body having the cross shape. For example, the protection pattern 200a may have a cross shape in a plan view and may extend from an intersection of two scribe lanes to be adjacent first to fourth semiconductor chips 110, 120, 130 and 140 and to contact the adjacent first to fourth semiconductor chips 110, 120, 130 and 140. For example, the protection pattern 200a may be one part. For example, the protection pattern 200a may be connected without any separated part between the first to fourth semiconductor chips 110, 120, 130 and 140. The protection pattern 200a may have a width substantially equal to or less than the width W of the scribe lane SL. For example, in certain embodiments, the protection pattern 200a may not contact the first to fourth semiconductor chips 110, 120, 130 and 140 in case the width of the protection pattern 200a is less than the width W of the scribe lane SL.

The protection pattern 200a may have a summed shape of the shapes of the first to fourth protection patterns 210, 220, 230 and 240 in FIG. 1. For example, the protection pattern 200a may have a shape such that the first to fourth protection patterns 210, 220, 230 and 240 of FIG. 1 are connected to each other by filling gaps between the first to fourth protection patterns 210, 220, 230 and 240 with the same material as the protection patterns. Thus, further descriptions with respect to the protection pattern 200a may be omitted herein for brevity.

Figure 15:
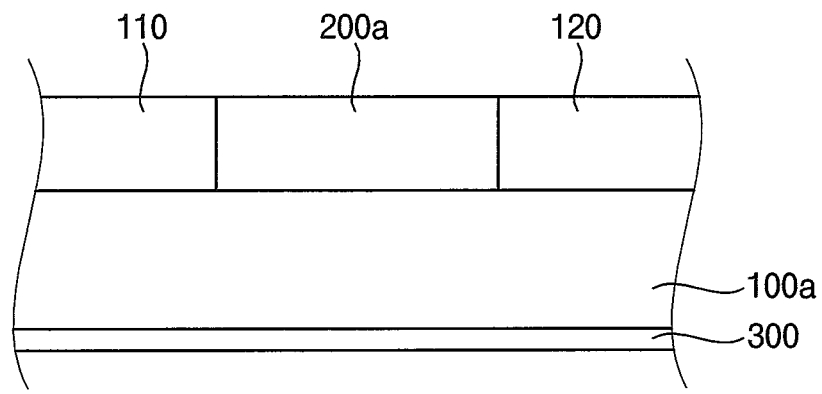
Figure 16:
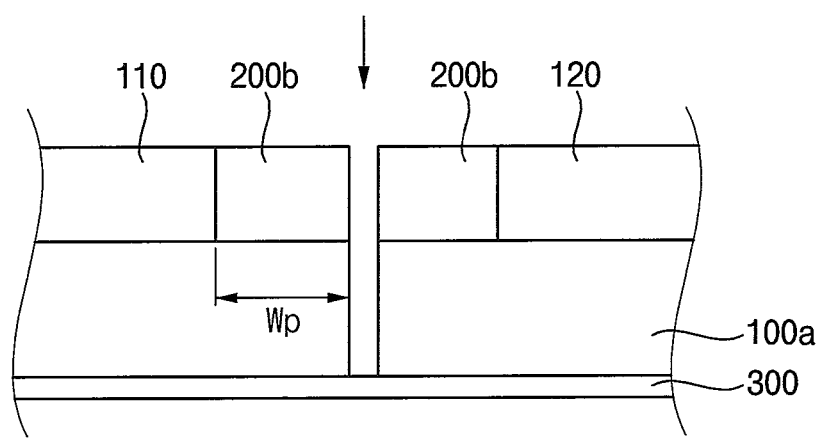
Figure 17:
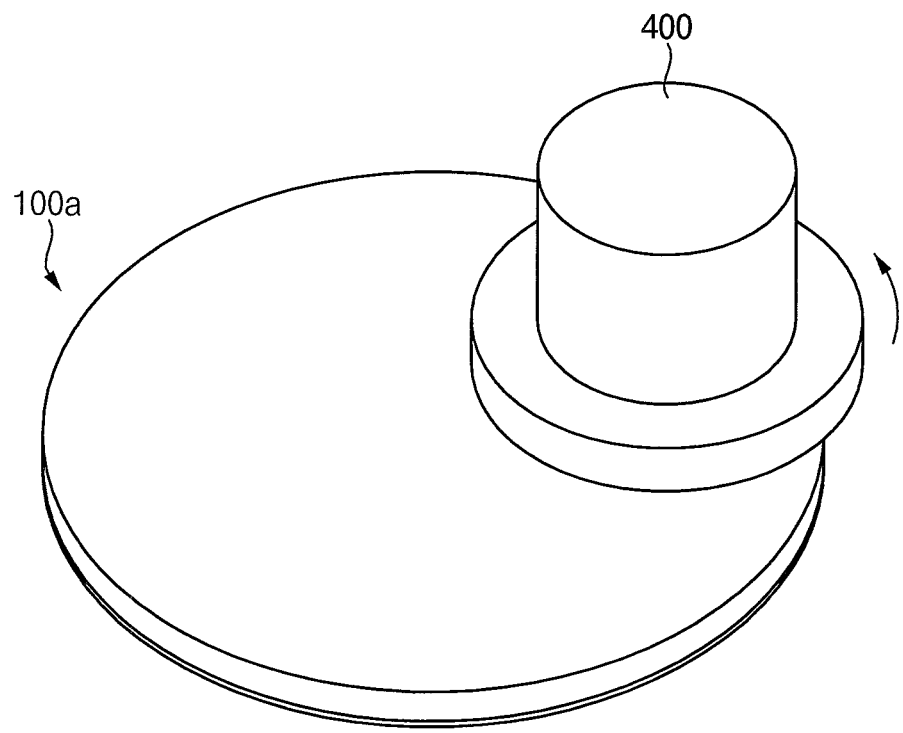
Figure 18:
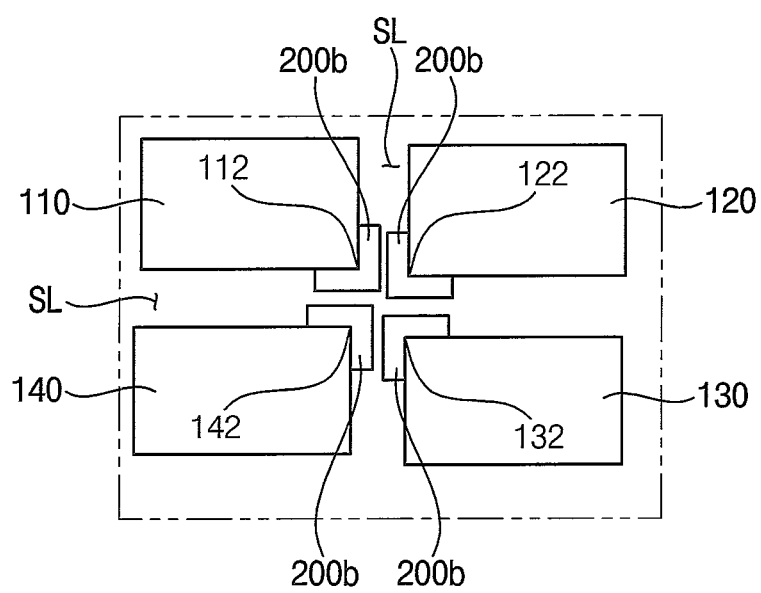

FIGS. 13 to 16 are cross-sectional views, FIG. 17 is a perspective view, and FIG. 18 is a plan view, collectively illustrating a method of sawing the semiconductor substrate in FIG. 10.

Figure 13:
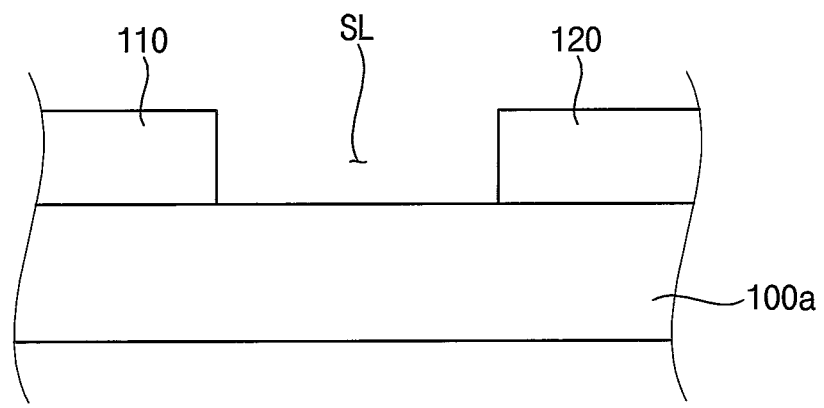

Referring to FIG. 13, the semiconductor chips in the semiconductor substrate 100a may be divided by the scribe lanes SL. FIG. 13 shows only the first semiconductor chip 110 and the second semiconductor chip 120 among the semiconductor chips.

Figure 14:
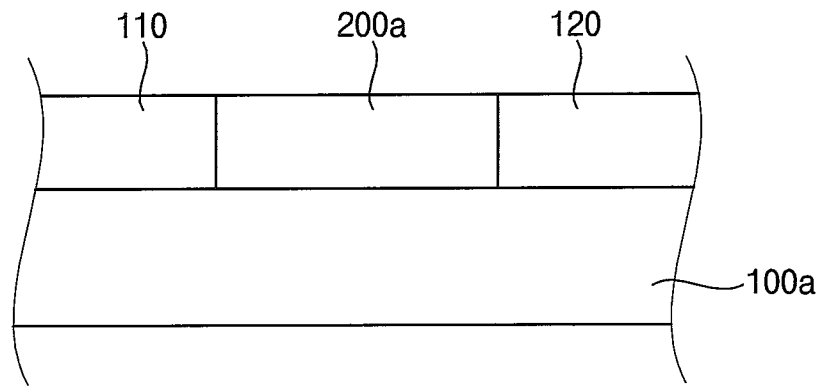

Referring to FIG. 14, the protection pattern 200a may be formed on the upper surface of the scribe lane SL. The protection pattern 200a may include or may be formed of photosensitive polyimide.

Referring to FIG. 15, a DAF 300 may be attached to the lower surface of the semiconductor substrate 100a.

Referring to FIG. 16, the laser may be irradiated to the protection pattern 200a and the scribe lane to cut the protection pattern 200a and the semiconductor substrate 100a along the scribe lane SL. Thus, the semiconductor chips may be singulated. Further, the protection pattern 200a may be divided into four sub patterns 200b. Each of the four sub patterns 200b may have a shape corresponding to the shapes of the first to fourth protection patterns 210, 220, 230 and 240, respectively. Thus, each of the four sub patterns 200b may have a width Wp of about 3/60 times to about 4/60 times the width W of the scribe lane SL.

In contrast, because the laser may not be irradiated to the DAF 300, the DAF 300 may not be cut. Thus, a cut line may be formed by the laser between the first semiconductor chip 110 and the second semiconductor chip 120. However, the first semiconductor chip 110 and the second semiconductor chip 120 may be connected with each other by the DAF 300 so that the first semiconductor chip 110 and the second semiconductor chip 120 may not be separated from each other. Because the DAF 300 may include or may be formed of a flexible material, the first semiconductor chip 110 and the second semiconductor chip 120 may move with respect to each other while the first and second semiconductor chips 110 and 120 are attached on the DAF 300.

Referring to FIG. 17, the upper surface of the semiconductor substrate 100a may be ground using a grinder to reduce the thickness of the semiconductor substrate 100a, i.e., the thicknesses of the first to fourth semiconductor chips 110, 120, 130 and 140.

The rotating grinder may grind the upper surface of the semiconductor substrate 100a so that the first to fourth corners 112, 122, 132 and 142 of the first to fourth semiconductor chips 110, 120, 130 and 140 may enter into the scribe lane SL to generate the collision between the first to fourth corners 112, 122, 132 and 142. For example, the DAF 300 may be flexible, and the first to fourth semiconductor chips 110, 120, 130 and 140 may move because of the flexibility of the DAF 300 so that the first to fourth semiconductor chips 110, 120, 130 and 140 may collide into each other.

However, as shown in FIG. 18, the four sub patterns 200b may surround the first to fourth corners 112, 122, 132 and 142 of the first to fourth semiconductor chips 110, 120, 130 and 140, respectively. Thus, the first to fourth corners 112, 122, 132 and 142 may be protected by the sub patterns 200b and may not collide with each other. As a result, the crack, which may be caused by the collision between the first to fourth corners 112, 122, 132 and 142, may not be generated at the first to fourth semiconductor chips 110, 120, 130 and 140.

According to example embodiments, the protection pattern in the scribe lane of the semiconductor substrate may surround the corners of the semiconductor chips to prevent the collision of the corners of the semiconductor chips in the grinding process. Thus, a crack may not be generated at the semiconductor chips.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention.

Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor substrate comprising:
    first to fourth semiconductor chips divided by two scribe lanes intersecting each other, the first to fourth semiconductor chips respectively including first to fourth corners disposed at the intersection of the two scribe lanes;
    a first protection pattern arranged at the intersection to surround the first corner of the first semiconductor chip; and
    a second protection pattern arranged at the intersection to surround the second corner of the second semiconductor chip, the second semiconductor chip diagonally opposite to the first semiconductor chip,
    wherein each of the first to fourth semiconductor chips has a rectangular shape in a plan view and has four side surfaces,
    wherein each of the first and second protection patterns has an L-shape including two portions extending perpendicularly to each other, a first portion of which extends on and contacts a first side surface of a corresponding semiconductor chip, and a second portion of which extends on and contacts a second side surface of the corresponding semiconductor chip, and
    wherein an upper surface of each of the first and second protection patterns is coplanar with an upper surface of the corresponding semiconductor chip.

2. The semiconductor substrate of claim 1, wherein the first and second protection patterns have the same shape, and each of the first and second protection patterns has a width of about 3/60 times to about 4/60 times a width of the scribe lanes.

3. The semiconductor substrate of claim 2, wherein each of the first and second protection patterns further comprises a round corner at a portion connecting the two portions.

4. The semiconductor substrate of claim 1, wherein the first and second protection patterns contact the first to fourth corners of the first to fourth semiconductor chips, respectively.

5. The semiconductor substrate of claim 1, wherein the first and second protection patterns comprise photosensitive polyimide.

6. The semiconductor substrate of claim 1, further comprising:
    a third protection pattern arranged at the intersection to surround the third corner of the third semiconductor chip; and
    a fourth protection pattern arranged at the intersection to surround the fourth corner of the fourth semiconductor chip, the fourth semiconductor chip diagonally opposite to the third semiconductor chip,
    wherein each of the third and fourth protection patterns has an L-shape including two portions extending perpendicularly to each other, a first portion of which extends on and contacts a first side surface of a corresponding semiconductor chip, and a second portion of which extends on and contacts a second side surface of the corresponding semiconductor chip, and
    wherein an upper surface of each of the third and fourth protection patterns is coplanar with an upper surface of the corresponding semiconductor chip.

7. The semiconductor substrate of claim 6, wherein the third and fourth protection patterns have the same shape, and each of the third and fourth protection patterns has a width of about 3/60 times to about 4/60 times a width of the scribe lanes.

8. The semiconductor substrate of claim 7, wherein each of the third and fourth protection patterns further comprises a round corner at a portion connecting the two portions.

9. The semiconductor substrate of claim 6, wherein the third and fourth protection patterns contact the first to fourth corners of the first to fourth semiconductor chips, respectively.

10. The semiconductor substrate of claim 6, wherein the third and fourth protection patterns comprise photosensitive polyimide.

11. A semiconductor substrate comprising:
    first to fourth semiconductor chips divided by two scribe lanes intersecting each other, corners of the first to fourth semiconductor chips disposed at the intersection of the two scribe lanes;
    a first protection pattern arranged at the intersection to surround the first corner of the first semiconductor chip; and
    a second protection pattern arranged at the intersection to surround the second corner of the second semiconductor chip, the second semiconductor chip diagonally opposite to the first semiconductor chip;
    wherein each of the first to fourth semiconductor chips has a rectangular shape in a plan view and has four side surfaces,
    wherein each of the first and second protection patterns contacts two side surfaces and a corner of each of the first to fourth semiconductor chips, the two side surfaces extending perpendicularly to each other and the two side surfaces meeting each other at the corner, and
    wherein an upper surface of the first and second protection patterns is coplanar with upper surfaces of the first to fourth semiconductor chips.

12. The semiconductor substrate of claim 11, wherein each of the first and second protection patterns comprises a plurality of sub patterns individually surrounding each of the corners.

13. The semiconductor substrate of claim 12, wherein shapes of the sub patterns are the same.

14. The semiconductor substrate of claim 13, wherein each of the sub patterns comprises two orthogonal portions extending in respective orthogonal directions.

15. The semiconductor substrate of claim 14, wherein each of the sub patterns further comprises a round corner at a connection portion between the two portions.

16. The semiconductor substrate of claim 13, wherein the sub patterns contact the corners of the first to fourth semiconductor chips respectively.

17. The semiconductor substrate of claim 13, wherein the sub patterns have upper surfaces coplanar with upper surfaces of the first to fourth semiconductor chips.

18. The semiconductor substrate of claim 13, wherein each of the sub patterns has a width of about 3/60 times to about 4/60 times a width of the scribe lanes.

19. The semiconductor substrate of claim 11, wherein each of the first and second protection patterns has a cross shape.

\* \* \* \* \*